United States Patent
Hua

(10) Patent No.: US 12,446,394 B2
(45) Date of Patent: Oct. 14, 2025

(54) LIGHT-EMITTING DEVICE AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Zhengshen Hua, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/622,855

(22) PCT Filed: Dec. 21, 2021

(86) PCT No.: PCT/CN2021/139858
§ 371 (c)(1),
(2) Date: Dec. 26, 2021

(87) PCT Pub. No.: WO2023/108702
PCT Pub. Date: Jun. 22, 2023

(65) Prior Publication Data
US 2024/0040811 A1 Feb. 1, 2024

(30) Foreign Application Priority Data
Dec. 14, 2021 (CN) .......................... 202111526760.2

(51) Int. Cl.
*H10K 50/11* (2023.01)
*H10K 101/00* (2023.01)
*H10K 101/30* (2023.01)

(52) U.S. Cl.
CPC .......... *H10K 50/11* (2023.02); *H10K 2101/30* (2023.02); *H10K 2101/90* (2023.02)

(58) Field of Classification Search
CPC ............... H10K 50/11; H10K 2101/30; H10K 2101/90; H10K 2101/40; H10K 50/13
See application file for complete search history.

(56) References Cited

U.S. PATENT DOCUMENTS

2005/0280008 A1  12/2005  Ricks
2009/0146560 A1*  6/2009  Kim .................... H10K 50/14
                                                  313/506
(Continued)

FOREIGN PATENT DOCUMENTS

CN  106654033 A  5/2017
CN  106856205 A  6/2017
(Continued)

OTHER PUBLICATIONS

"Collections." Ossila, Jul. 11, 2019, www.ossila.com/products. Accessed Sep. 27, 2024. (Year: 2019).*
(Continued)

*Primary Examiner* — Jarrett J Stark
(74) *Attorney, Agent, or Firm* — PV IP PC; Wei Te Chung

(57) ABSTRACT

A display module and a mobile terminal are provided, which includes a light-emitting backplane. The light-emitting backplane includes a substrate, and an electromagnetic induction layer and a light-emitting component layer sequentially arranged on the substrate. The light-emitting component layer includes a plurality of light-emitting components distributed in an array along a first direction and a second direction intersecting with each other. The electromagnetic induction layer includes first electromagnetic induction coils arranged in the first direction and extending to the second direction and second electromagnetic induc-
(Continued)

tion coils arranged in the second direction and extending to the first direction.

16 Claims, 3 Drawing Sheets

(56) References Cited

U.S. PATENT DOCUMENTS

| | | | | |
|---|---|---|---|---|
| 2017/0222171 | A1* | 8/2017 | Hamada | H10K 59/876 |
| 2018/0240994 | A1* | 8/2018 | Pentlehner | H10K 50/19 |
| 2019/0036055 | A1* | 1/2019 | Lin | H10K 50/81 |
| 2019/0288212 | A1* | 9/2019 | Cho | H10K 85/658 |
| 2019/0372013 | A1* | 12/2019 | Noh | H10K 85/654 |
| 2020/0168818 | A1* | 5/2020 | Lin | H10K 85/30 |
| 2020/0190100 | A1* | 6/2020 | Yoon | C07D 519/00 |

FOREIGN PATENT DOCUMENTS

| | | | | |
|---|---|---|---|---|
| CN | 108232025 A | * | 6/2018 | H01L 51/5016 |
| CN | 109148710 A | | 1/2019 | |
| CN | 113571655 A | | 10/2021 | |
| CN | 113725377 A | | 11/2021 | |

OTHER PUBLICATIONS

Negi, S., Mittal, P., & Kumar, B. (2017). Performance analysis of OLED with Hole Block Layer and impact of multiple hole block layer. Communications in Computer and Information Science, 452-462. https://doi.org/10.1007/978-981-10-7470-7_45 (Year: 2017).*
International Search Report in International application No. PCT/CN2021/139858, mailed on Sep. 14, 2022.
Written Opinion of the International Search Authority in International application No. PCT/CN2021/139858,mailed on Sep. 14, 2022.

* cited by examiner

LIGHT-EMITTING DEVICE AND DISPLAY PANEL

FIELD OF INVENTION

This application relates to the fields of display technologies, in particular to a light-emitting device and display panel.

BACKGROUND OF INVENTION

Organic light-emitting diode (OLED) display panels have been widely used in people's life, such as display screens of mobile phones, computers, vehicles, and so on. Organic light-emitting diode (OLED) display panel includes light-emitting components, which include red light-emitting components, green light-emitting components, and blue light-emitting components. With the development of display technologies and people's demand for progress in display technologies, people are demanding higher and higher requirements for the brightness and other display qualities of display panels, and have developed light-emitting components with double light-emitting layers to enhance brightness.

However, the conventional light-emitting components with double light-emitting layers still have the problems that the luminous efficiency is not high enough, the brightness cannot meet the use of demand, and the service life of light-emitting components cannot be guaranteed.

Technical Problem

The embodiments of the present application provide a light-emitting device and a display panel, which can solve the problems that the conventional light-emitting devices with double light-emitting layers still have the problems that the luminous efficiency is not high enough, the brightness cannot meet the use of demand, and the service life of light-emitting devices cannot be guaranteed.

SUMMARY OF INVENTION

Technical Solutions

The embodiments of the application provide a light-emitting device, which includes:
a first electrode;
a second electrode arranged on a side of the first electrode;
a first light-emitting material layer; and
a second light-emitting material layer stacked with the first light-emitting material layer and located between the first electrode and the second electrode;
wherein host materials of the first light-emitting material layer and the second light-emitting material layer include a N-type material and a P-type material, a LUMO energy level of the N-type material ranges from −2.05 eV to −3.32 eV, a HOMO energy level of the P-type material ranges from −5.46 eV to −6.54 eV, and a difference between the LUMO energy level of the N-type material and the HOMO energy level of the P-type material is greater than or equal to 2.6 eV.

Optionally, in some embodiments of the present application, the first light-emitting material layer includes a first host material layer, and the first host material layer includes a first N-type material and a first P-type material;
the second light-emitting material layer includes a second host material layer, and the second host material layer includes a second N-type material and a second P-type material; and
the first N-type material is same as the second N-type material, and the first P-type material is same as the second P-type material.

Optionally, in some embodiments of the present application, the first light-emitting material layer includes a first host material layer and a third host material layer, the first host material layer includes a first N-type material and a first P-type material, the first host material layer and the third host material layer are stacked, and a difference of LUMO energy levels between the first host material layer and the third host material layer ranges from 0.2 eV to 0.4 eV;
the second light-emitting material layer includes a second host material layer, and the second host material layer includes a second N-type material and a second P-type material.

Optionally, in some embodiments of the present application, the third host material layer includes at least one of a third N-type material and a third P-type material.

Optionally, in some embodiments of the present application, the second light-emitting material layer further includes a fourth host material layer; the second host material layer and the fourth host material layer are stacked, and a difference of LUMO energy levels between the second host material layer and the fourth host material layer ranges from 0.2 eV to 0.4 eV.

Optionally, in some embodiments of the present application, the second light-emitting material layer further includes a fourth host material layer; the second host material layer and the fourth host material layer are stacked, and a difference of LUMO energy levels between the second host material layer and the fourth host material layer ranges from 0.2 eV to 0.4 eV.

Optionally, in some embodiments of the present application, the fourth host material layer includes at least one of a fourth N-type material and a fourth P-type material.

Optionally, in some embodiments of the present application, the fourth host material layer includes at least one of a fourth N-type material and a fourth P-type material.

Accordingly, the embodiments of the present application also provide a display panel, which includes a light-emitting device, which includes:
a first electrode;
a second electrode arranged on a side of the first electrode;
a first light-emitting material layer; and
a second light-emitting material layer stacked with the first light-emitting material layer and located between the first electrode and the second electrode;
wherein host materials of the first light-emitting material layer and the second light-emitting material layer include a N-type material and a P-type material, a LUMO energy level of the N-type material ranges from −2.05 eV to −3.32 eV, a HOMO energy level of the P-type material ranges from −5.46 eV to −6.54 eV, and a difference between the LUMO energy level of the N-type material and the HOMO energy level of the P-type material is greater than or equal to 2.6 eV.

Optionally, in some embodiments of the present application, the first light-emitting material layer includes a first host material layer, and the first host material layer includes a first N-type material and a first P-type material;

the second light-emitting material layer includes a second host material layer, and the second host material layer includes a second N-type material and a second P-type material; and the first N-type material is same as the second N-type material, and the first P-type material is same as the second P-type material.

Optionally, in some embodiments of the present application, the first light-emitting material layer includes a first host material layer and a third host material layer, the first host material layer includes a first N-type material and a first P-type material, the first host material layer and the third host material layer are stacked, and a difference of LUMO energy levels between the first host material layer and the third host material layer ranges from 0.2 eV to 0.4 eV;

the second light-emitting material layer includes a second host material layer, and the second host material layer includes a second N-type material and a second P-type material.

Optionally, in some embodiments of the present application, the third host material layer includes at least one of a third N-type material and a third P-type material.

Optionally, in some embodiments of the present application, the second light-emitting material layer further includes a fourth host material layer; the second host material layer and the fourth host material layer are stacked, and a difference of LUMO energy levels between the second host material layer and the fourth host material layer ranges from 0.2 eV to 0.4 eV.

Optionally, in some embodiments of the present application, the second light-emitting material layer further includes a fourth host material layer;

the second host material layer and the fourth host material layer are stacked, and a difference of LUMO energy levels between the second host material layer and the fourth host material layer ranges from 0.2 eV to 0.4 eV.

Optionally, in some embodiments of the present application, the fourth host material layer includes at least one of a fourth N-type material and a fourth P-type material.

Optionally, in some embodiments of the present application, the fourth host material layer includes at least one of a fourth N-type material and a fourth P-type material.

Optionally, in some embodiments of the present application, the first light-emitting material layer includes a first host material layer, and the first host material layer includes a first N-type material and a first P-type material;

a mass ratio of the first N-type material and the first P-type material in the first host material layer ranges from 1:9 to 9:1.

Optionally, in some embodiments of the present application, the second light-emitting material layer includes a second host material layer, and the second host material layer includes a second N-type material and a second P-type material; and a mass ratio of the second N-type material and the second P-type material in the second host material layer ranges from 1:9 to 9:1.

Optionally, in some embodiments of the present application, thicknesses of the first light-emitting material layer and the second light-emitting material layer range from 15 nm to 50 nm.

Optionally, in some embodiments of the present application, the display panel further including: a plurality of red light-emitting components, a plurality of green light-emitting components and a plurality of blue light-emitting components, at least one of the green light-emitting component and the blue light-emitting component includes the light-emitting device.

Beneficial Effect

In the embodiment of the application, a light-emitting device and a display panel are provided. The light-emitting device includes a first light-emitting material layer and a second light-emitting material layer stacked, the first light-emitting material layer and the second light-emitting material layer are sandwiched between a first electrode and a second electrode, and the host materials of the first light-emitting material layer and the second light-emitting material layer both include N-type material and P-type material. A mixture of the N-type material and the P-type material form an exciplex under the condition of light excitation or electric field excitation. The transmissions of holes and/or electrons by the double host material is relatively balanced, and the exciton composite region is more dispersed. It can improve the luminous efficiency of light-emitting devices, improve the brightness of light-emitting devices, and improve the service life of light-emitting devices and display panels.

DRAWINGS

In order to more clearly explain the technical solutions according to the embodiments of the present application, the following will briefly introduce the drawings that need to be used in the description of the embodiments. It is apparent that the drawings in the following description are only some embodiments of the present application. For those of skilled in the art can obtain other drawings based on these drawings without any creative work.

DETAILED DESCRIPTION OF EMBODIMENTS

The technical solutions in the embodiments of the present application will be clearly and completely described below in conjunction with the drawings in the embodiments of the present application. It is apparent that the described embodiments are only a part of the embodiments of the present application, rather than all the embodiments. On the basis of the embodiments of the present application, all other embodiments obtained by those skilled in the art without any creative work belong to the protection scope of the present application. In addition, it should be understood that the specific embodiments described herein are only used to illustrate and explain the application and are not used to limit the application. In the present application, in the absence of a contrary explanation, the location terms used herein, such as "above" and "below", usually refer to top and bottom of the device in actual use or working condition, specifically the direction of the accompanying drawings; while "inside" and "outside" are for an outline of the device.

The embodiment of the application provides a light-emitting device and a display panel. The following contents are detailed descriptions. It should be noted that the order of description of the following embodiments is not a limitation on the preferred order of the embodiments.

Example 1

Figure 1:
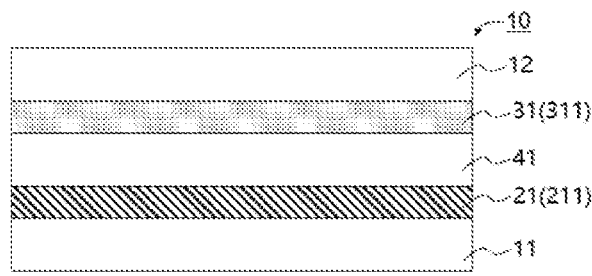
FIG. 1 is a first schematic structural view of a light-emitting device provided by an embodiment of the present application.
Figure 2:
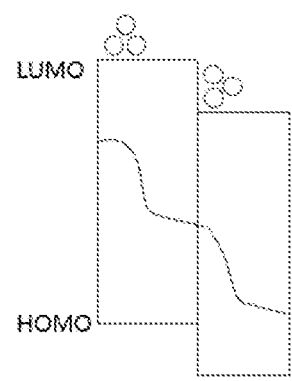
FIG. 2 is a schematic view of the light-emitting process of a light-emitting device provided by an embodiment of the present application.

Referring to FIGS. 1 and 2. FIG. 1 is the first schematic structural view of a light-emitting device 10 provided by an embodiment of the present application. FIG. 2 is a schematic view of the light-emitting process of the light-emitting device 10 provided by an embodiment of the present application.

In the embodiment of the present application, a light-emitting device 10 is provided. The light-emitting device 10 includes a first electrode 11, a second electrode 12, a first light-emitting material layer 31 and a second light-emitting material layer 21. The second light-emitting material layer 21 and the first light-emitting material layer 31 are stacked and located between the first electrode 11 and the second electrode 12. Host materials of the first light-emitting material layer 31 and the second light-emitting material layer 21 include a N-type material and a P-type material, a LUMO energy level of the N-type material ranges from −2.05 eV to −3.32 eV, a HOMO energy level of the P-type material ranges from −5.46 eV to −6.54 eV, and a difference between the LUMO energy level of the N-type material and the HOMO energy level of the P-type material is greater than or equal to 2.6 eV.

Specifically, the second light-emitting material layer 21 and the first light-emitting material layer 31 are stacked, the second light-emitting material layer 21 and the first light-emitting material layer 31 are located between the first electrode 11 and the second electrode 12, and the positional relationship between the second light-emitting material layer 21 and the first light-emitting material layer 31 is not limited.

Specifically, the light-emitting device 10 includes a double host material, the double host material is the second light-emitting material layer 21 and the first light-emitting material layer 31, and the host materials of the first light-emitting material layer 31 and the second light-emitting material layer 21 both include N-type material and P-type material.

Specifically, the LUMO energy level of the N-type material ranges from −2.05 eV to −3.32 eV, the HOMO energy level of the P-type material ranges from −5.46 eV to −6.54 eV, and a difference between the LUMO energy level of the N-type material and the HOMO energy level of the P-type material is greater than or equal to 2.6 eV, which can optimize and improve the luminous efficiency of the first luminous material layer 31 and the second luminous material layer 21.

Specifically, the second light-emitting material layer 21 and the first light-emitting material layer 31 also include a guest material, respectively.

In some embodiments, the N-type material includes a first N-type material and a second N-type material, and the P-type material includes a first P-type material and a second P-type material. The first light-emitting material layer 31 includes a first host material layer 311, which includes the first N-type material and the first P-type material. The second light-emitting material layer 21 includes the second host material layer 211, which includes the second N-type material and the second P-type material.

In some embodiments, the first N-type material is same as the second N-type material, and the first P-type material is same as the second P-type material.

Specifically, by configuring that the first N-type material is same as the second N-type material, and the first P-type material is same as the second P-type material, which can reduce the types of N-type material and P-type material while achieve the double host materials of the light-emitting device 10 and enhance the light-emitting efficiency of the light-emitting device.

In some embodiments, the first N-type material and the second N-type material are different, and the first P-type material and the second P-type material are different.

Specifically, by configuring that the first N-type material and the second N-type material are different, and the first P-type material and the second P-type material are different, the first light-emitting material layer 31 and the second light-emitting material layer 21 can use different types of N-type materials and P-type materials while achieving the double host material of the light-emitting device 10, so as to expand the material selection scope and improve the light-emitting efficiency of the light-emitting device.

In some embodiments, as shown in FIG. 2, a mass ratio of the first N-type material and the first P-type material in the first host material layer 311 ranges from 1:9 to 9:1. Adjusting the ratio of N-type material and P-type material make the mass ratio of the first N-type material and the first P-type material appropriate, which can broaden the exciton composite region, reduce exciton quenching, improve the luminous efficiency of light-emitting devices, and make the exciton composite region move toward an inner side of the light-emitting layer, so as to improve the interface ageing and prolong the service life of light-emitting devices.

In some embodiments, as shown in FIG. 2, a mass ratio of the second N-type material and the second P-type material in the second host material layer 211 ranges from 1:9 to 9:1. Adjusting the ratio of N-type material and P-type material make the mass ratio of the second N-type material and the second P-type material appropriate, which can broaden the exciton composite region, reduce exciton quenching, improve the luminous efficiency of light-emitting devices, and make the exciton composite region move toward an inner side of the light-emitting layer, so as to improve the interface ageing and prolong the service life of light-emitting devices.

In some embodiments, thicknesses of the first light-emitting material layer 31 and the second light-emitting material layer 21 range from 15 nm to 50 nm.

Specifically, the first electrode may be an anode and the second electrode may be a cathode, or the first electrode may be a cathode and the second electrode may be an anode.

In the embodiments of the present application, the light-emitting device 10 includes a double host material layer (the first light-emitting material layer 31 and the second light-emitting material layer 21). Therefore, the transmission of electrons in the first light-emitting material layer 31 and/or the second light-emitting material layer 21 can be delayed, the energy transmission from the host material to the guest material can be improved, the exciton composite region can move toward the inner side of the light-emitting layer, so as to broaden the exciton composite region, delay the ageing of the light-emitting device 10 and prolong the service life of the light-emitting device 10. It also can make the operating voltage of the light-emitting device 10 reduce and the current efficiency of the light-emitting device 10 improve.

In an embodiment of the application, a light-emitting device 10 is provided. The second light-emitting material layer 21 and the first light-emitting material layer 31 both include a mixture of a N-type material and a P-type material. The mixture of the N-type material and the P-type material form an exciplex under the condition of light excitation or electric field excitation. The transmissions of holes and/or electrons by the double host material is relatively balanced, and the exciton composite region is more dispersed. It can improve the luminous efficiency of light-emitting devices, improve the brightness of light-emitting devices, and improve the service life of light-emitting devices and display panels.

Example 2

This embodiment is same as or similar to example 1, except that the structure of the light-emitting device 10 is further limited.

Figure 3:
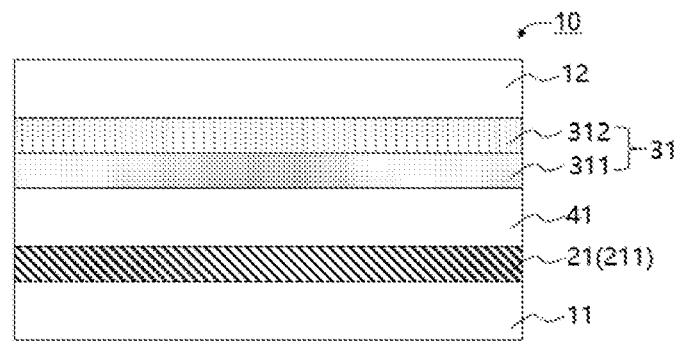
FIG. 3 is a second schematic structural view of a light-emitting device provided by an embodiment of the present application.

Referring to FIG. 3, FIG. 3 is a second schematic structural view of a light-emitting device 10 provided by an embodiment of the present application.

In some embodiments, the N-type material further includes a third N-type material, and the P-type material further includes a third P-type material. The first light-emitting material layer 31 further includes a third host material layer 312, and the third host material layer 312 includes the third N-type material or the third P-type material. The first host material layer 311 and the third host material layer 312 are stacked, and a difference of LUMO energy levels between the first host material layer 311 and the third host material layer 312 ranges from 0.2 eV to 0.4 eV.

Specifically, the first light-emitting material layer 31 includes the first host material layer 311 and the third host material layer 312 stacked, and the third host material layer 312 includes the third N-type material or the third P-type material.

Specifically, the third host material layer 312 includes one of the third N-type material and the third P-type material.

In an embodiment of the application, a light-emitting device 10 is provided. The second light-emitting material layer 21 and the first light-emitting material layer 31 both include a mixture of N-type material and P-type material. The mixture of the N-type material and the P-type material form an exciplex under the condition of light excitation or electric field excitation. The transmissions of holes and/or electrons by the double host material is relatively balanced, and the exciton composite region is more dispersed. It can improve the luminous efficiency of light-emitting devices, improve the brightness of light-emitting devices, and improve the service life of light-emitting devices and display panels.

Example 3

This embodiment is same as or similar to example 1, except that the structure of the light-emitting device 10 is further limited.

In some embodiments, the N-type material further includes a third N-type material, and the P-type material further includes a third P-type material. The first light-emitting material layer 31 further includes a third host material layer 312, and the third host material layer 312 includes the third N-type material and the third P-type material. The first host material layer 311 and the third host material layer 312 are stacked, and a difference of LUMO energy levels between the first host material layer 311 and the third host material layer 312 ranges from 0.2 eV to 0.4 eV.

Specifically, the first light-emitting material layer 31 includes a first host material layer 311 and a third host material layer 312 stacked, and the third host material layer 312 includes a third N-type material and a third P-type material.

Specifically, the third host material layer 312 includes both of the third N-type material and the third P-type material.

In some embodiments, a mass ratio of the third N-type material and the third P-type material in the third host material layer 312 ranges from 1:9 to 9:1.

In an embodiment of the application, a light-emitting device 10 is provided. The second light-emitting material layer 21 and the first light-emitting material layer 31 both include a mixture of N-type material and P-type material. The mixture of the N-type material and the P-type material form an exciplex under the condition of light excitation or electric field excitation. The transmissions of holes and/or electrons by the double host material is relatively balanced, and the exciton composite region is more dispersed. It can improve the luminous efficiency of light-emitting devices, improve the brightness of light-emitting devices, and improve the service life of light-emitting devices and display panels.

Example 4

This embodiment is same as or similar to example 2 and example 3, except that it further limits the structure of the light-emitting device 10.

Figure 4:
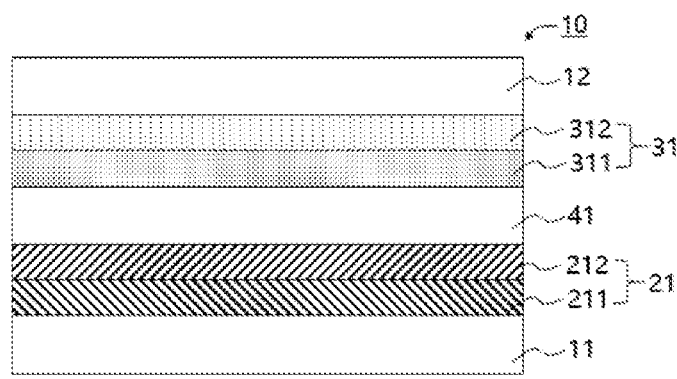
FIG. 4 is a third schematic structural view of a light-emitting device provided by an embodiment of the present application.

Referring to FIG. 4, FIG. 4 is a third schematic structural view of a light-emitting device 10 provided by an embodiment of the present application.

In some embodiments, the N-type material further includes a fourth N-type material, and the P-type material further includes a fourth P-type material. The second light-emitting material layer 21 further includes a fourth host material layer 212, and the fourth host material layer 212 includes the fourth N-type material or the fourth P-type material. The second host material layer and the fourth host material layer 212 are stacked, and a difference of LUMO energy levels between the second host material layer 211 and the fourth host material layer 212 ranges from 0.2 eV to 0.4 eV.

Specifically, the fourth host material layer 212 includes one of the fourth N-type material and the fourth P-type material.

Specifically, in some embodiments, the first light-emitting material layer 31 includes the first host material layer 311 and the third host material layer 312 stacked, and the third host material layer 312 includes the third N-type material or the third P-type material. The second light-emitting material layer 21 includes the second host material layer 211 and the fourth host material layer 212, the second host material layer 211 includes the second N-type material and the second P-type material, and the fourth host material layer 212 includes the fourth N-type material or the fourth P-type material.

Specifically, in some embodiments, the first light-emitting material layer 31 includes a first host material layer 311 and a third host material layer 312 stacked, and the third host material layer 312 includes the third N-type material and the third P-type material. The second light-emitting material layer 21 includes the second host material layer 211 and the fourth host material layer 212, the second host material layer 211 includes the second N-type material and the second P-type material, and the fourth host material layer 212 includes the fourth N-type material or the fourth P-type material.

In an embodiment of the application, a light-emitting device 10 is provided. The second light-emitting material layer 21 and the first light-emitting material layer 31 both include a mixture of N-type material and P-type material. The mixture of the N-type material and the P-type material form an exciplex under the condition of light excitation or electric field excitation. The transmissions of holes and/or electrons by the double host material is relatively balanced, and the exciton composite region is more dispersed. It can improve the luminous efficiency of light-emitting devices, improve the brightness of light-emitting devices, and improve the service life of light-emitting devices and display panels.

Example 5

This embodiment is same as or similar to example 2 and example 3, except that it further limits the structure of the light-emitting device 10.

In some embodiments, the N-type material further includes a fourth N-type material, and the P-type material further includes a fourth P-type material. The second light-emitting material layer 21 further includes a fourth host material layer 212, and the fourth host material layer 212 includes the fourth N-type material and the fourth P-type material. The second host material layer and the fourth host material layer 212 are stacked, and a difference of LUMO energy levels between the second host material layer 211 and the fourth host material layer 212 ranges from 0.2 eV to 0.4 eV.

Specifically, the fourth host material layer 212 includes both of the fourth N-type material and the fourth P-type material.

In some embodiments, a mass ratio of the fourth N-type material and the fourth P-type material in the fourth host material layer 212 ranges from 1:9 to 9:1.

Specifically, in some embodiments, the first light-emitting material layer 31 includes a first host material layer 311 and a third host material layer 312 stacked, and the third host material layer 312 includes the third N-type material or the third P-type material. The second light-emitting material layer 21 includes the second host material layer 211 and the fourth host material layer 212, the second host material layer 211 includes the second N-type material and the second P-type material, and the fourth host material layer 212 includes the fourth N-type material and the fourth P-type material.

Specifically, in some embodiments, the first light-emitting material layer 31 includes a first host material layer 311 and a third host material layer 312 stacked, and the third host material layer 312 includes the third N-type material and the third P-type material. The second light-emitting material layer 21 includes the second host material layer 211 and the fourth host material layer 212, the second host material layer 211 includes the second N-type material and the second P-type material, and the fourth host material layer 212 includes the fourth N-type material and the fourth P-type material.

In an embodiment of the application, a light-emitting device 10 is provided. The second light-emitting material layer 21 and the first light-emitting material layer 31 both include a mixture of N-type material and P-type material. The mixture of the N-type material and the P-type material form an exciplex under the condition of light excitation or electric field excitation. The transmissions of holes and/or electrons by the double host material is relatively balanced, and the exciton composite region is more dispersed. It can improve the luminous efficiency of light-emitting devices, improve the brightness of light-emitting devices, and improve the service life of light-emitting devices and display panels.

Example 6

Figure 5:
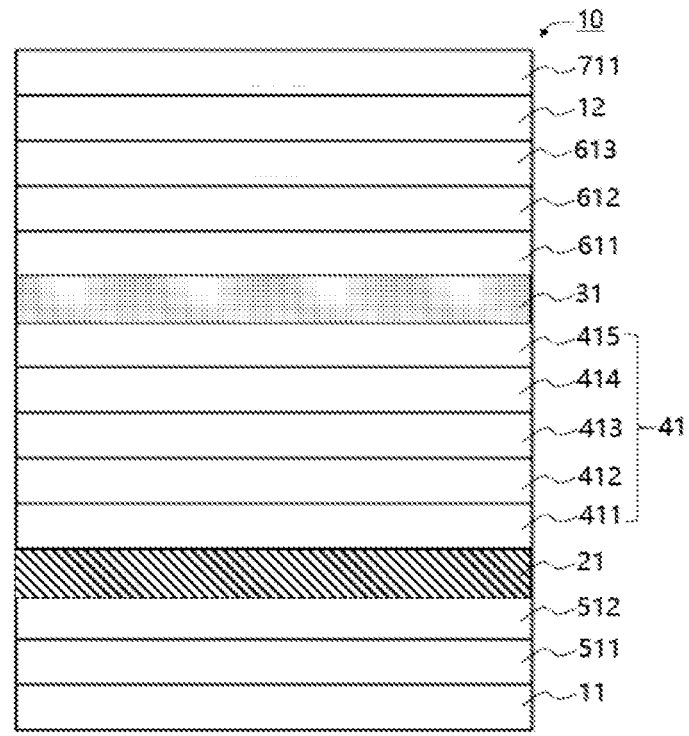
FIG. 5 is a fourth schematic structural view of a light-emitting device provided by an embodiment of the present application.

Referring to FIGS. 1, 3, 4, and 5. FIG. 5 is a fourth schematic structural view of the light-emitting device 10 provided by the embodiment of the present application.

The present embodiment is same as or similar to the above embodiments, except that the film layer structure between the first light-emitting material layer 31 and the second light-emitting material layer 21 is further defined.

In some embodiments, between the first light-emitting material layer 31 and the second light-emitting material layer 21, it further includes at least one of a hole blocking layer (HBL), an electron transport and injection layer (ETL), a charge generation layer (CGL), a hole injection and transport layer (HTL), and an electron blocking layer (EBL).

Specifically, the hole blocking layer (HBL) is represented by 411 and 611 in FIG. 5, the electron transport and injection layer (ETL) is represented by 412 and 612 in FIG. 5, the hole injection and transport layer (HTL) is represented by 414 and 511 in FIG. 5, the electron blocking layer (EBL) is represented by 512 and 415 in FIG. 5, the charge generation layer (CGL) is represented by 413 in FIG. 5, and the electron injection layer (EIL) is represented by 613 in FIG. 5.

Specifically, between the first light-emitting material layer 31 and the second light-emitting material layer 21, it further includes a connection layer 41, the connection layer includes at least one of a hole blocking layer (HBL), an electron transport and injection layer (ETL), a charge generation layer (CGL), a hole injection and transport layer (HTL), and an electron blocking layer (EBL). When a plurality of layer structures are included between the first light-emitting material layer 31 and the second light-emitting material layer 21, the light-emitting device 10 may include sequentially stacked structures of: the second light-emitting material layer 21, the hole blocking layer (HBL), the electron transport and injection layer (ETL), the charge generation layer (CGL), the hole injection and transport layer (HTL), the electron blocking layer (EBL), and the first light-emitting material layer 31; or the light-emitting device 10 may include a sequentially stacked structure of: the first light-emitting material layer 31, the hole blocking layer (HBL), the electron transport and injection layer (ETL), and the charge generation layer (CGL), hole injection and transport layer (HTL), electron blocking layer (EBL), and second light-emitting material layer 21.

Specifically, as shown in FIG. 5, specifically, when the first electrode 11 may be an anode and the second electrode 12 may be a cathode, one or both of the hole injection and transport layer (HTL) and the electron blocking layer (EBL) may also be included between the second light-emitting material layer 21 and the first electrode 11. The sequentially stacked layers included in the light-emitting device 10 may be: the first electrode, the hole injection and transport layer (HTL), the electron blocking layer (EBL), and the second light-emitting material layer 21.

Specifically, as shown in FIG. 5, when the first electrode 11 may be an anode and the second electrode 12 may be a cathode, at least one of the hole blocking layer (HBL), the electron transport and injection layer (ETL) and the electron injection layer (EIL) may be included between the first light-emitting material layer 31 and the second electrode 12. The sequentially stacked layers included in the light-emitting device 10 may be: the first light-emitting material layer 31, the hole blocking layer (HBL), the electron transport and injection layer (ETL), the electron injection layer (EIL), and the second electrode 12.

As shown in FIG. 5, FIG. 5 illustrates the sequentially stacked layers included in the light-emitting device 10 may be: the first electrode hole injection and transport layer (HTL), the electron blocking layer (EBL), the second light-emitting material layer 21, the hole blocking layer (HBL), the electron transport and injection layer (ETL), the charge generation layer (CGL), the hole injection and transport layer (HTL), the electron blocking layer (EBL), the first light-emitting material layer 31, the hole blocking layer (HBL), the electron transport and injection layer (ETL), the electron injection layer (EIL), the second electrode 12.

Specifically, the hole injection and transport layer (HTL) adopts hole transport and injection materials, not limited to one or more materials, and a thickness of hole injection and transport layer (HTL) ranges from 80 nm to 150 nm. The electron blocking layer (EBL) adopts materials with hole transport and electron blocking effect, not limited to one or more materials, and a thickness of electron blocking layer ranges from 5 nm to 90 nm. The hole blocking layer (HBL) adopts a material with hole blocking and electron transport, and a thickness of the hole blocking layer ranges from 5 nm to 15 nm, that is not limited to one or more materials. The electron transport and injection layer (ETL) may be a doping with ET material with Li compound, which is not limited to one or more materials, and a thickness of the electron transport and injection layer ranges from 25 nm to 35 nm. When the second electrode 12 is used as a cathode, the second electrode 12 may be alloys of Mg—Ag, Ag, Al, Al—Ca. A thickness of the charge generation layer 413 (CGL) ranges from 15 nm to 25 nm.

Specifically, when the second electrode 12 is a cathode, a light extraction layer (CPL) 711 may further be arranged on a side of the second electrode 12 away from the first electrode 11. The light extraction layer (CPL) 711 is formed of a material with high refractive index.

It should be noted that the N-type material and P-type material in the above embodiments both refer to the host material.

It should be noted that the first light-emitting material layer 31 and the second light-emitting material layer 21 both include a guest material, which is easily understood by those skilled in the art and does not be repeated again.

Specifically, the first light-emitting material layer 31 and the second light-emitting material layer 21 may use the same host material or different host materials, and the first light-emitting material layer 31 and the second light-emitting material layer 21 may use the same guest material or different guest materials. The N-type materials and the P-type materials may be fluorescent materials, TADF materials, superfluorescent materials, etc.

It should be noted that, in this embodiment, the detailed structure of the light-emitting device 10 is illustrated by taking the first electrode 11 as the anode and the second electrode 12 as the cathode. However, in the above-mentioned examples 1 to 5, the first electrode 11 is an anode and the second electrode 12 is a cathode. Alternatively, the first electrode 11 may be a cathode and the second electrode 12 may be an anode.

Example 7

Figure 6:
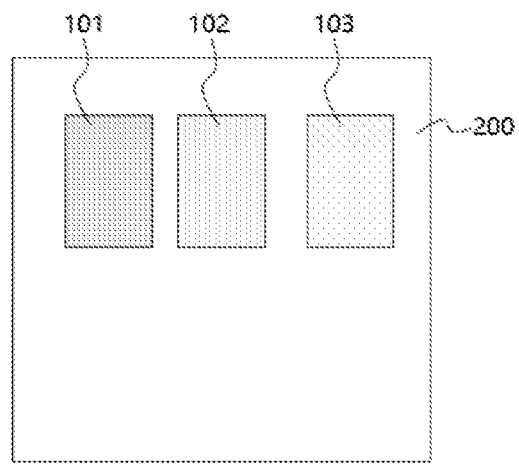
FIG. 6 is a schematic view of a display panel provided by an embodiment of the present application.

Referring to FIG. 6, FIG. 6 is a schematic view of a display panel 200 provided by an embodiment of the present application.

The present embodiment provides a display panel 200, which includes the light-emitting device 10 according to any of the above examples.

In some embodiments, the display panel 200 includes a red light-emitting component 101, a green light-emitting component 102, and a blue light-emitting component 103. At least one of the green light-emitting component 102 and the blue light-emitting component 103 includes the light-emitting device 10 according to any of the above examples.

Specifically, the green light-emitting component 102 has a maximum brightness, and the use of the light-emitting device 10 can improve the brightness of the display panel.

Specifically, the blue light-emitting component 103 has a worst service life, and the use of the light-emitting device 10 can improve the service life of the display panel.

Specifically, the red light-emitting component 101 has a moderate brightness and service life. The red light-emitting component 101 may adopt a structure different from the light-emitting device 10, for example, it only contains the N-type material or the P-type material, which can simplify the process.

The above description describes a light-emitting device and display panel provided by the embodiments of the present application in detail. In this context, specific examples are used to explain the principle and implementation means of the present application. The description of the above embodiments is only used to help understand the methods and core ideas of the present application. Moreover, for those skilled in the art, they may change in the specific implementation means and application scope according to the ideas of the present application. In summary, the content of this specification should not be construed as a limitation to the present application.

What is claimed is:

1. A light-emitting device, comprising:
    a first electrode;
    a second electrode arranged on a side of the first electrode;
    a first light-emitting material layer; and
    a second light-emitting material layer provided in lamination with the first light-emitting material layer and located between the first electrode and the second electrode;
    wherein host materials of the first light-emitting material layer and the second light-emitting material layer comprise a N-type material and a P-type material, a LUMO energy level of the N-type material ranges from −2.05 eV to −3.32 eV, a HOMO energy level of the P-type material ranges from −5.46 eV to −6.54 eV, and a difference between the LUMO energy level of the N-type material and the HOMO energy level of the P-type material is greater than or equal to 2.6 Ev; and a mixture of the N-type material and the P-type material form an exciplex under light excitation or electric field excitation;
    wherein the first light-emitting material layer comprises a first host material layer and a third host material layer, the first host material layer comprises a first N-type material and a first P-type material, the first host material layer and the third host material layer are stacked, and a difference of LUMO energy levels between the first host material layer and the third host material layer ranges from 0.2 eV to 0.4 eV;

the second light-emitting material layer comprises a second host material layer, and the second host material layer comprises a second N-type material and a second P-type material.

2. The light-emitting device according to claim 1, wherein the third host material layer comprises at least one of a third N-type material and a third P-type material.

3. The light-emitting device according to claim 1, wherein the second light-emitting material layer further comprises a fourth host material layer, the second host material layer, and the fourth host material layer are stacked, and a difference of LUMO energy levels between the second host material layer and the fourth host material layer ranges from 0.2 eV to 0.4 eV.

4. The light-emitting device according to claim 2, wherein the second light-emitting material layer further comprises a fourth host material layer, the second host material layer, and the fourth host material layer are stacked, and a difference of LUMO energy levels between the second host material layer and the fourth host material layer ranges from 0.2 eV to 0.4 eV.

5. The light-emitting device according to claim 3, wherein the fourth host material layer comprises at least one of a fourth N-type material and a fourth P-type material.

6. The light-emitting device according to claim 4, wherein the fourth host material layer comprises at least one of a fourth N-type material and a fourth P-type material.

7. A display panel comprises a light-emitting device, wherein the light-emitting device comprises:
  a first electrode;
  a second electrode arranged on a side of the first electrode;
  a first light-emitting material layer; and
  a second light-emitting material layer provided in lamination with the first light-emitting material layer and located between the first electrode and the second electrode;
  wherein host materials of the first light-emitting material layer and the second light-emitting material layer comprise a N-type material and a P-type material, a LUMO energy level of the N-type material ranges from −2.05 eV to −3.32 eV, a HOMO energy level of the P-type material ranges from −5.46 eV to −6.54 eV, and a difference between the LUMO energy level of the N-type material and the HOMO energy level of the P-type material is greater than or equal to 2.6 eV; and a mixture of the N-type material and the P-type material form an exciplex under light excitation or electric field excitation;
  wherein the first light-emitting material layer comprises a first host material layer and a third host material layer, the first host material layer comprises a first N-type material and a first P-type material, the first host material layer and the third host material layer are stacked, and a difference of LUMO energy levels between the first host material layer and the third host material layer ranges from 0.2 eV to 0.4 eV;
  the second light-emitting material layer comprises a second host material layer, and the second host material layer comprises a second N-type material and a second P-type material.

8. The display panel according to claim 7, wherein the third host material layer comprises at least one of a third N-type material and a third P-type material.

9. The display panel according to claim 7, wherein the second light-emitting material layer further comprises a fourth host material layer, the second host material layer, and the fourth host material layer are stacked, and a difference of LUMO energy levels between the second host material layer and the fourth host material layer ranges from 0.2 eV to 0.4 eV.

10. The display panel according to claim 8, wherein the second light-emitting material layer further comprises a fourth host material layer, the second host material layer, and the fourth host material layer are stacked, and a difference of LUMO energy levels between the second host material layer and the fourth host material layer ranges from 0.2 eV to 0.4 eV.

11. The display panel according to claim 9, wherein the fourth host material layer comprises at least one of a fourth N-type material and a fourth P-type material.

12. The display panel according to claim 10, wherein the fourth host material layer comprises at least one of a fourth N-type material and a fourth P-type material.

13. The display panel according to claim 7, wherein the first light-emitting material layer comprises a first host material layer, and the first host material layer comprises a first N-type material and a first P-type material;
  a mass ratio of the first N-type material and the first P-type material in the first host material layer ranges from 1:9 to 9:1.

14. The display panel according to claim 13, wherein the second light-emitting material layer comprises a second host material layer, and the second host material layer comprises a second N-type material and a second P-type material;
  a mass ratio of the second N-type material and the second P-type material in the second host material layer ranges from 1:9 to 9:1.

15. The display panel according to claim 7, wherein thicknesses of the first light-emitting material layer and the second light-emitting material layer range from 15 nm to 50 nm.

16. The display panel according to claim 7, further comprising: a plurality of red light-emitting components, a plurality of green light-emitting components and a plurality of blue light-emitting components,
  wherein at least one of the green light-emitting component and the blue light-emitting component comprises the light-emitting device.

* * * * *